(12) United States Patent
Narayan

(10) Patent No.: US 11,339,470 B2
(45) Date of Patent: May 24, 2022

(54) DIAMOND NANOFIBERS AND METHODS OF MAKING DIAMOND NANOFIBERS AND LARGE-SIZE DIAMONDS

(71) Applicant: North Carolina State University, Raleigh, NC (US)

(72) Inventor: Jagdish Narayan, Raleigh, NC (US)

(73) Assignee: North Carolina State University, Raleigh, NC (US)

( * ) Notice: Subject to any disclaimer, the term of this patent is extended or adjusted under 35 U.S.C. 154(b) by 16 days.

(21) Appl. No.: 16/677,999

(22) Filed: Nov. 8, 2019

(65) Prior Publication Data

US 2020/0149151 A1 May 14, 2020

Related U.S. Application Data

(60) Provisional application No. 62/757,392, filed on Nov. 8, 2018.

(51) Int. Cl.
*C23C 16/02* (2006.01)
*C23C 16/27* (2006.01)

(52) U.S. Cl.
CPC ........ *C23C 16/0209* (2013.01); *C23C 16/271* (2013.01)

(58) Field of Classification Search
CPC .......................... C23C 16/0209; C23C 16/271
See application file for complete search history.

(56) References Cited

U.S. PATENT DOCUMENTS

| H1249 H | * | 11/1993 | Machonkin | ........... | C23C 16/271 |
| | | | | | 438/21 |
| 2009/0285744 A1 | * | 11/2009 | Sugihara | ................. | C30B 29/04 |
| | | | | | 423/446 |
| 2017/0036917 A1 | * | 2/2017 | Narayan | ................. | C30B 31/22 |

OTHER PUBLICATIONS

Wei, et al; "The mechanism of phase transformation from carbon nanotube to diamond", Carbon 36, 997. (Year: 1998).*
Angus et al., "Low-pressure, metastable growth of diamond and "diamondlike" phases", Science, 1988, 241, 913-21.
Narayan, et al., "Laser method for synthesis and processing of continuous diamond films on nondiamond substrates", Science, 1991, 252, 416-8.
Bundy, et al., "Man-made diamonds", Nature, 1955, 176, 51-55.
Narayan et al., "Novel phase of carbon, ferromagnetism, and conversion into diamond", J. Appl. Phys., 2015, 118, 215303.
Narayan et al., "Research update: direct conversion of amorphous carbon into diamond at ambient pressures and temperatures in air", APL Mater., 2015, 3, 100702.
Narayan et al., "Direct conversion of h-BN into c-BN and formation of epitaxial c-BN/diamond heterostructures", J. Appl. Phys., 2016, 119, 185302.
Bai, et al., "Aligned diamond nanowhiskers", J. Mater. Res., 15, 923 (2000).
Ando, et al., "Nano-rods' of single crystalline diamond", Diamond Related Materials, 13, 633 (2004).
Sun, et al., "Diamond nanorods from carbon nanotubes", Adv. Mater., 2004, 16, 1849-1853.
Hsu, et al., "Synthesis of diamond nanowires using atmospheric-pressure chemical vapor deposition", Nano Lett., 2010, 10, 3272-3276.
Wei, et al., "The mechanism of phase transformation from carbon nanotube to diamond", Carbon 36, 997 (1998).
Luo, et al., "Diamond synthesis from carbon nanofibers at low temperature and low pressure", Sci. Rep., 2015, 5, 13879.
Zhang, et al., "Conversion of carbon nanotubes to diamond by spark plasma sintering", Carbon N. Y., 2005, 43, 1254-1258.
Ozden, et al., "Ballistic fracturing of carbon nanotubes", ACS Appl. Mater. Interfaces, 2016, 8, 24819-24825.
Wang et al., "Transformation of carbon nanotubes to diamond at high pressure and high temperature", Russ. Phys. J., 2001, 44, 178-182.
Zhang, et al., "Pseudo-topotactic conversion of carbon nanotubes to T-carbon nanowires under picosecond laser irradiation in methanol", Nat. Commun., 2017, 8, 683.
Prawer et al., "Raman spectroscopy of diamond and doped diamond", Philos. Trans. R. Soc. London A. 2004, 362, 2537-2565.
Singh et al., "A novel method for simulating laser-solid interactions in semiconductors and layered structures", Mat. Sci. and Eng. B(3), 217 (1989).
Narayan et al., "Pulsed laser melting of amorphous silicon layers", Appl. Phys. Lett., 1984, 44, 35.
Narayan, et al., "Phase transformation and impurity redistribution during pulsed laser irradiation of amorphous silicon layers", J. Appl. Phys., 1984, 56, 1821.
Wood, et al., "Bulk nucleation and amorphous phase formation in highly undercooled molten silicon", Appl. Phys. Lett., 1984, 44, 770.

* cited by examiner

*Primary Examiner* — Michael P Wieczorek
(74) *Attorney, Agent, or Firm* — Thomas Horstemeyer, LLP

(57) ABSTRACT

The present disclosure provides methods for forming diamond nanostructures and diamonds from amorphous carbon nanostructures in ambient temperature and pressure by irradiating carbon nanostructures to an undercooled state and quenching the melted carbon to convert a portion of the nanostructure into diamond.

18 Claims, 10 Drawing Sheets

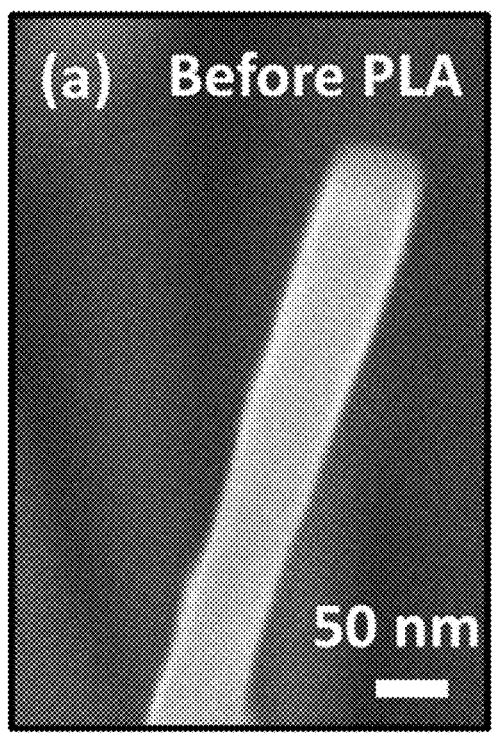
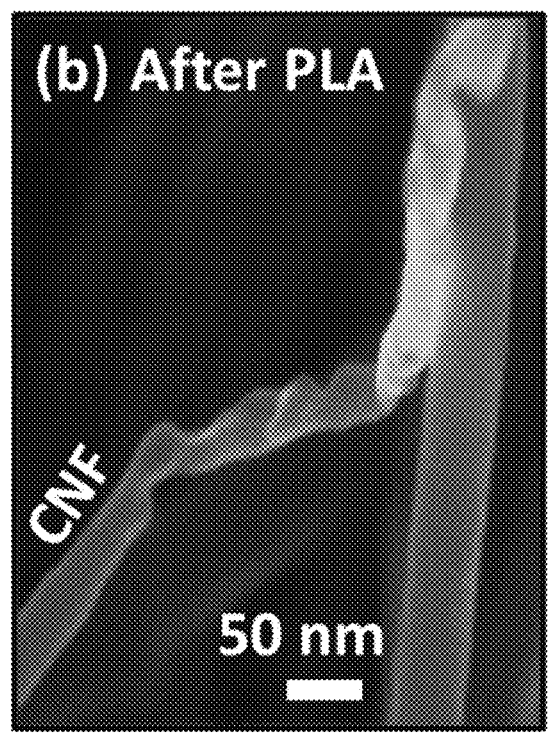
FIG. 1A  FIG. 1B
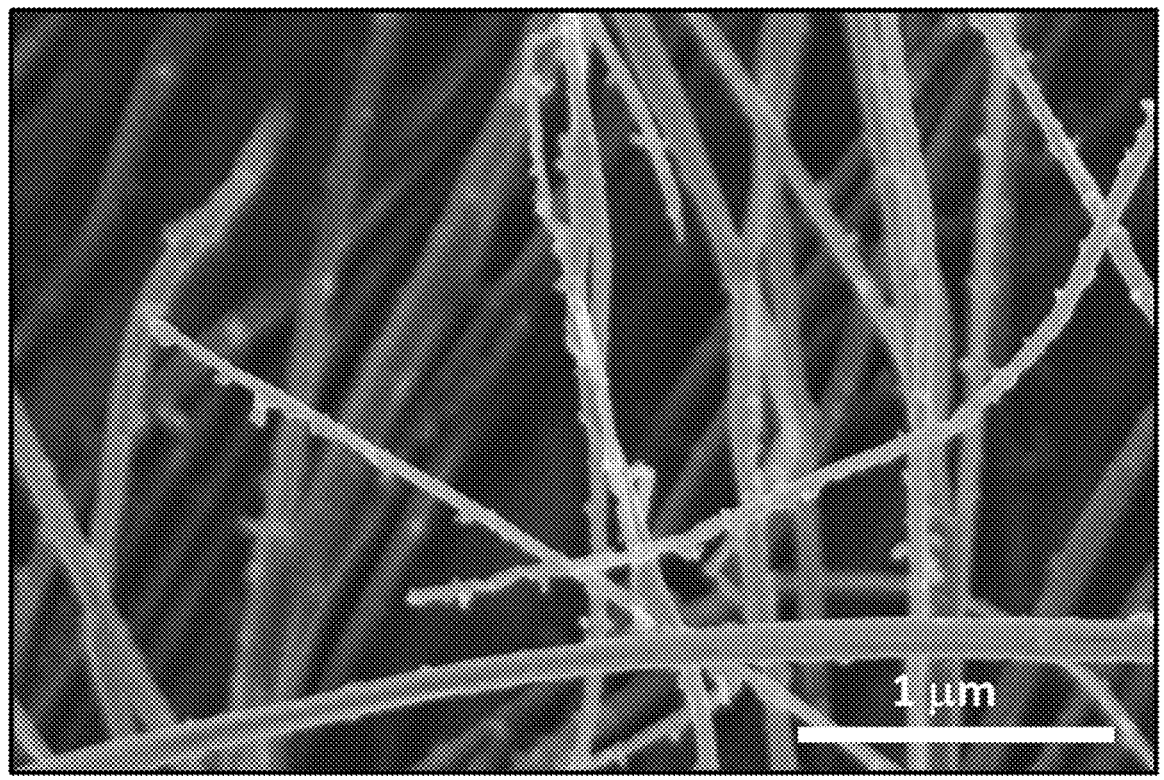
FIG. 2

DIAMOND NANOFIBERS AND METHODS OF MAKING DIAMOND NANOFIBERS AND LARGE-SIZE DIAMONDS

CROSS-REFERENCE TO RELATED APPLICATIONS

This application claims the benefit of and priority to U.S. Provisional Application Ser. No. 62/757,392, having the title "DIAMOND NANOFIBERS AND METHODS OF MAKING DIAMOND NANOFIBERS AND LARGE-SIZE DIAMONDS", filed on Nov. 8, 2018, the disclosure of which is incorporated herein by reference in its entirety.

STATEMENT REGARDING FEDERALLY SPONSORED RESEARCH OR DEVELOPMENT

This invention was made with government support under grant DMR1735695 awarded by the National Science Foundation. The government has certain rights in the invention.

BACKGROUND

Direct conversion of carbon into diamond has fascinated and challenged scientists from all over the world for the longest time. According to the thermodynamic equilibrium phase diagram, carbon/graphite can be converted into diamond at extremely high temperature (5000K) and pressure (12 GPa). The process requires extreme temperatures and pressures and occurs via natural processes in the earth's crust. Diamond grits are also produced industrially, and the extreme temperatures and pressures can be somewhat reduced in the presence of an appropriate catalyst. The process is thermodynamically challenging, and the ability to easily and efficiently create diamond would provide many exciting technological applications ranging from quantum computing, sensing, and communication to tool coatings for oil and gas exploration and deep-sea drilling, in addition to beautiful diamond jewelry. Furthermore, diamond nanorods can play a critical role in nanoscale quantum technology and devices. Current methods for synthesis of diamond nanorods are cumbersome, inefficient, and present toxicity concerns.

SUMMARY

Briefly described, in various aspects, the present disclosure provides methods of forming diamond nanostructures and diamonds. In embodiments, methods of forming diamond nanostructures include: providing carbon nanostructures comprising amorphous carbon; in an environment at ambient temperature and pressure, irradiating the carbon nanostructures with a laser pulse sufficient to melt at least a first portion of the amorphous carbon to an undercooled state; and quenching the melted carbon from the undercooled state to convert at least the first portion of the amorphous carbon nanostructure into a diamond nanostructure.

According to some embodiments of the disclosure, methods of forming diamond nanostructures include: providing carbon nanofibers and/or carbon nanotubes comprising amorphous carbon; in an environment at ambient temperature and pressure, irradiating the carbon nanofibers and/or nanotubes with a laser pulse sufficient to melt at least a first portion of the amorphous carbon to an undercooled state; quenching the melted carbon from the undercooled state to convert at least the first portion of the amorphous carbon nanostructure into diamond; and repeating the melting and quenching steps to convert additional portions of the nanostructure into diamond.

The present disclosure also provides methods of forming diamond, where the method includes providing laser-annealed diamond-carbon fibers formed by the methods of the present disclosure, and performing hot-filament chemical vapor deposition (HFCVD) to form diamond crystallites.

Other systems, methods, devices, features, and advantages of the devices and methods will be or become apparent to one with skill in the art upon examination of the following drawings and detailed description. It is intended that all such additional systems, methods, devices, features, and advantages be included within this description, be within the scope of the present disclosure, and be protected by the accompanying claims

BRIEF DESCRIPTION OF THE DRAWINGS

Further aspects of the present disclosure will be more readily appreciated upon review of the detailed description of its various embodiments, described below, when taken in conjunction with the accompanying drawings.

FIGS. 1A-1B are high-resolution scanning electron microscopy (SEM) images illustrating a carbon nanofiber (CNF) before (FIG. 1A) and after (FIG. 1B) pulsed laser annealing (PLA) and demonstrating the conversion of carbon nanofibers into diamond nanofibers.

FIG. 2 is a high-resolution SEM image illustrating conversion of carbon nanofibers of different diameters, where thin fibers are completely converted into diamond and thick fibers show diamond formation on the surface. Some of the surface nuclei grow into diamond nanorod projections normal to the substrate along the diameter of the nanofiber.

FIG. 7A is an SEM micrograph showing conversion of carbon nanotubes into diamond after 10 pulses of argon fluoride (ArF) laser (pulse duration 20 ns) at 0.65 $Jcm^{-2}$; FIGS. 7B and 7C are magnifications showing details of the conversion process starting from the tips; and FIG. 7D is a magnification of the process of nucleation of diamond in the middle of the nanotube and growth of diamond nanorods normal to the tube.

DETAILED DESCRIPTION

Figure 3:
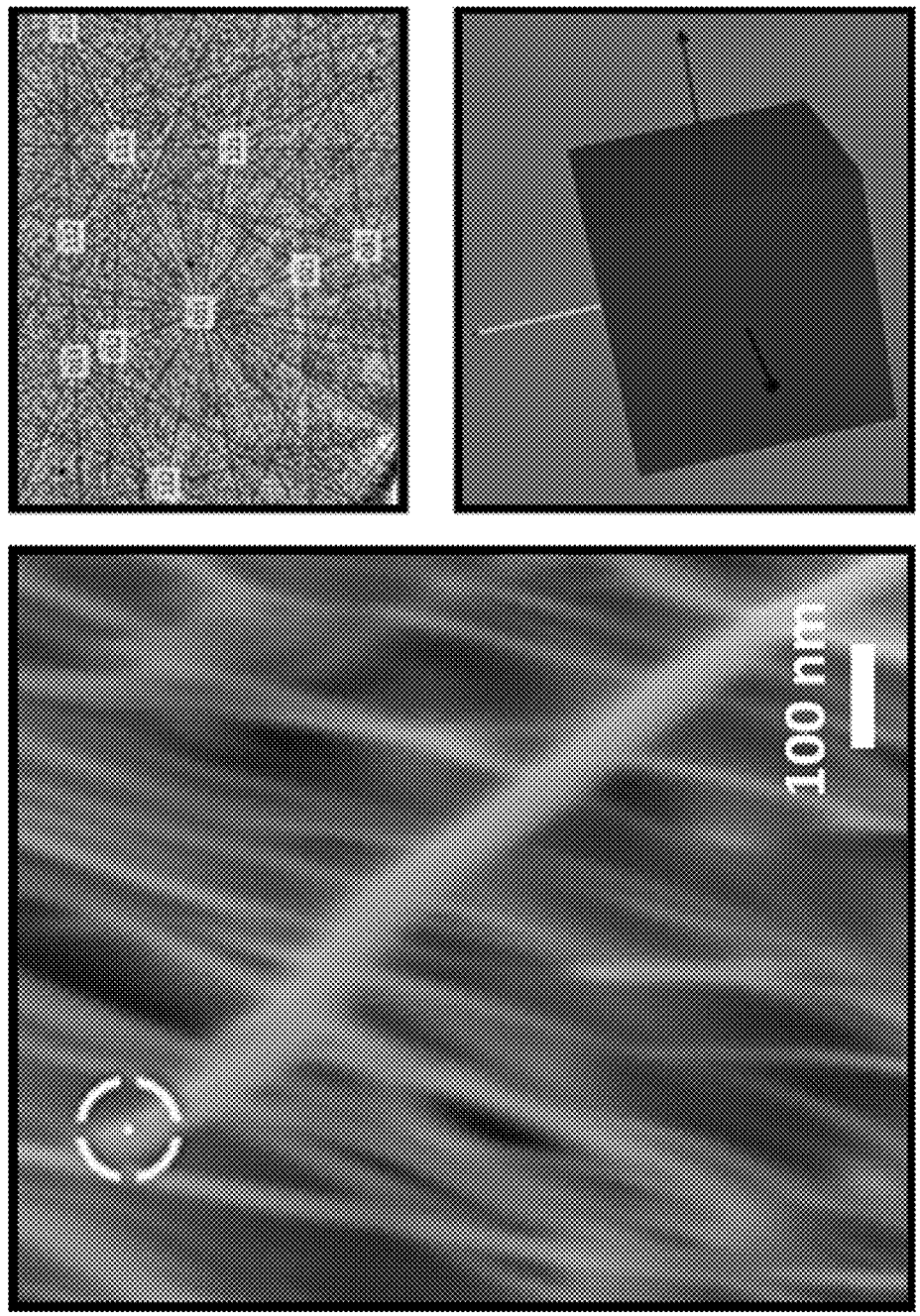
FIG. 3 is an SEM micrograph illustrating laser treated fibers (left) with electron-backscatter diffraction (EBSD) (Kikuchi) pattern characteristic of diamond (top right) and orientation of diamond cube (bottom right) in the diamond formed.

Before the present disclosure is described in greater detail, it is to be understood that this disclosure is not limited to particular embodiments described, as such may, of course, vary. It is also to be understood that the terminology used herein is for the purpose of describing particular embodiments only, and is not intended to be limiting, since the scope of the present disclosure will be limited only by the appended claims.

Where a range of values is provided, it is understood that each intervening value, to the tenth of the unit of the lower limit (unless the context clearly dictates otherwise), between the upper and lower limit of that range, and any other stated or intervening value in that stated range, is encompassed within the disclosure. The upper and lower limits of these smaller ranges may independently be included in the smaller ranges and are also encompassed within the disclosure, subject to any specifically excluded limit in the stated range. Where the stated range includes one or both of the limits, ranges excluding either or both of those included limits are also included in the disclosure.

Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the present disclosure, the preferred methods and materials are now described.

As will be apparent to those of skill in the art upon reading this disclosure, each of the individual embodiments described and illustrated herein has discrete components and features which may be readily separated from or combined with the features of any of the other several embodiments without departing from the scope or spirit of the present disclosure. Any recited method can be carried out in the order of events recited or in any other order that is logically possible.

Embodiments of the present disclosure will employ, unless otherwise indicated, techniques of chemistry, physics, thermodynamics, and the like, which are within the skill of the art. Such techniques are explained fully in the literature.

The following examples are put forth so as to provide those of ordinary skill in the art with a complete disclosure and description of how to perform the methods and use the compositions and compounds disclosed and claimed herein. Efforts have been made to ensure accuracy with respect to numbers (e.g., amounts, temperature, etc.), but some errors and deviations should be accounted for. Unless indicated otherwise, parts are parts by weight, temperature is in ° C., and pressure is at or near atmospheric. Standard temperature and pressure are defined as 20° C. and 1 atmosphere.

Before the embodiments of the present disclosure are described in detail, it is to be understood that, unless otherwise indicated, the present disclosure is not limited to particular materials, reagents, reaction materials, manufacturing processes, or the like, as such can vary. It is also to be understood that the terminology used herein is for purposes of describing particular embodiments only, and is not intended to be limiting. It is also possible in the present disclosure that steps can be executed in different sequence where this is logically possible.

All publications and patents cited in this specification are cited to disclose and describe the methods and/or materials in connection with which the publications are cited. Publications and patents that are incorporated by reference, where noted, are incorporated by reference as if each individual publication or patent were specifically and individually indicated to be incorporated by reference. Such incorporation by reference is expressly limited to the methods and/or materials described in the cited publications and patents and does not extend to any lexicographical definitions from the cited publications and patents. Any lexicographical definition in the publications and patents cited that is not also expressly repeated in the instant application should not be treated as such and should not be read as defining any terms appearing in the accompanying claims. Any terms not specifically defined within the instant application, including terms of art, are interpreted as would be understood by one of ordinary skill in the relevant art; thus, is not intended for any such terms to be defined by a lexicographical definition in any cited art, whether or not incorporated by reference herein, including but not limited to, published patents and patent applications. The citation of any publication is for its disclosure prior to the filing date and should not be construed as an admission that the present disclosure is not entitled to antedate such publication by virtue of prior disclosure. Further, the dates of publication provided could be different from the actual publication dates that may need to be independently confirmed.

It must be noted that, as used in the specification and the appended claims, the singular forms "a," "an," and "the" include plural referents unless the context clearly dictates otherwise. Thus, for example, reference to "a cell" includes a plurality of cells. In this specification and in the claims that follow, reference will be made to a number of terms that shall be defined to have the following meanings unless a contrary intention is apparent.

As used herein, the following terms have the meanings ascribed to them unless specified otherwise. In this disclosure, "consisting essentially of" or "consists essentially" or the like, when applied to methods and compositions encompassed by the present disclosure refers to compositions like those disclosed herein, but which may contain additional structural groups, composition components or method steps (or analogs or derivatives thereof as discussed above). Such additional structural groups, composition components or method steps, etc., however, do not materially affect the basic and novel characteristic(s) of the compositions or methods, compared to those of the corresponding compositions or methods disclosed herein. "Consisting essentially of" or "consists essentially" or the like, when applied to methods and compositions encompassed by the present disclosure have the meaning ascribed in U.S. patent law and the term is open-ended, allowing for the presence of more than that which is recited so long as basic or novel characteristics of that which is recited is not changed by the presence of more than that which is recited, but excludes prior art embodiments.

Prior to describing the various embodiments, the following definitions are provided and should be used unless otherwise indicated.

Discussion

In accordance with the purpose(s) of the present disclosure, as embodied and broadly described herein, embodiments of the present disclosure, in some aspects, relate to methods and systems for producing diamond rods and fibers and larger size diamonds from carbon fibers. In embodiments, methods of the present disclosure use pulsed laser annealing (PLA) to convert carbon fibers/tubes into diamond fibers/tubes at ambient temperature and pressure.

Diamond nanorods have been synthesized by chemical vapor deposition (CVD) with hydrogen and plasma etching of polycrystalline films. However, these methods are cumbersome as they involve toxic gases at high temperatures with limited yield. The methods of the present disclosure lead to the formation of phase-pure diamond rods across the scale, ranging from a few nanometers to micrometers and beyond, depending upon initial size of carbon nanotubes and carbon fibers. Furthermore, in the methods of the present disclosure, the conversion process occurs at ambient temperature and pressure and can be carried out in air.

Diamond growth by chemical vapor deposition (hot-filament or microwave-plasma CVD) requires seeding on which carbon-containing CHx species are attached during diamond growth. Carbide forming substrates provide these nucleation sites. In the case of noncarbide forming substrates, strain centers and surface roughening by scratching and pulsed laser annealing can provide diamond nucleation sites.

One-dimensional structures of diamond with sizes ranging from nano- to micrometers will play a useful role for nanoscale devices with new functionalities, ranging from quantum computing, sensing, and communication to field emission displays. Conversion of carbon tubes and fibers into diamond fibers/rods provides a direct access to these devices. Diamond nanorods (DNRs) in the form of pillars have been created from polycrystalline [7], and single-crystal [8] diamond films by using microwave plasma and reactive ion etching methods. This is a very expensive and cumbersome process with a limited yield. Other extensive research efforts in this area have focused on direct formation of DNRs using CVD (chemical vapor deposition) methods and direct conversion of carbon into diamond.

The CVD-based methods require atomic hydrogen and carbon-containing species. Formation of DNRs with 4-8 nm diameter and ~100 nm length was reported by Sun, et al. after prolonged (>20 h) hydrogen plasma treatment of carbon nanotubes at 1000K [9]. Hsu, et al. reported the synthesis of DNRs by chemical vapor deposition at ambient pressure by introducing hydrogen during carbon nanotube (CNT) growth process [10]. In both of these cases, carbon nanotubes provide the source for carbon-containing CHx species and nucleation sites for diamond growth. These methods produce diamond mixed with amorphous carbon with limited yield, and involve toxic gases at high temperatures.

In the area of direct conversion, Wei, et al. reported the conversion of carbon nanotubes into diamond through the formation of carbon onion phase [11]. The process involved coating of the carbon nanotubes on a cast iron substrate, followed by $CO_2$ CW laser irradiation. Luo, et al. reported the formation of diamond nanocrystals at the tips of carbon nanofibers after spark plasma sintering (SPS) at 1500° C. and atmospheric pressure, and explained it via the formation by an intermediate phase of carbon onion [12]. Zhang, et al. found the conversion of tips of multi-walled carbon nanotubes (MWCNTs) into diamond after SPS at 1200° C. and via a route of nanotube to carbon onion to diamond process [13]. Ozden, et al. showed that ballistic fracturing of CNTs can lead to formation of nanodiamonds [14], which is consistent with conventional modes of transformation of carbon nanotubes into diamond at high pressures and temperatures (4.5 GPa at 1300° C.) [15]. More recently, J. Zhang, et al. described the conversion of carbon nanotubes into T-carbon by using pico-second laser irradiation [16]. All of the above-described methods suffer from drawbacks such as inefficiency, high cost, toxicity, and the like. None of these methods involved melting as the mechanism for the conversion of carbon into diamond.

Recently, conversion of carbon into diamond was accomplished by overcoming thermodynamic constraints with the help of kinetics [4-5]. By using high-power nanosecond laser pulses, amorphous carbon layers were melted in a highly undercooled state and quenched subsequently into phase-pure diamond or into a new phase of carbon, Q-carbon, at a higher undercooling. Q-carbon is different from the known phases of carbon (e.g., graphite and diamond). Remarkably, similar results were obtained for the conversion of hexagonal boron nitride (h-BN) into pure cubic BN (c-BN) or super undercooled BN (Q-BN) [6]. (see, e.g., US 2017/0370019 by Narayan, and WO 2018/148147A1 by Narayan, which are hereby incorporated by reference herein).

The present disclosure now describes the efficient conversion of carbon fibers (available inexpensively) and carbon nanotubes into diamond fibers by nanosecond pulsed lasers at ambient temperatures and pressures. The conversion process involves melting and starts at the tips and bends of the fibers, which can be extended with the number of pulses to cover entire lengths. Below a critical fiber diameter, there is a complete conversion into diamond. Above this diameter, diamond nanocrystallites are formed on the surface, some of which grow rapidly to form diamond nanorods normal to the substrate fiber. These laser-annealed fibers can be used as seeds for further growth to obtain larger sizes of diamonds and larger areas using conventional HFCVD (hot-filament chemical vapor deposition) and PECVD (plasma-enhanced chemical vapor deposition). Comparison of the methods of the present disclosure using laser-annealed fibers to those using untreated carbon fibers reveals considerably enhanced diamond nucleation and growth in laser-annealed fibers.

In embodiments, the present disclosure includes methods of forming diamond nanostructures (e.g., diamond nanorods (DNR), diamond nanofibers (DNF), diamond nanotubes, diamond nanoneedles, etc.). Embodiments of these methods include providing carbon nanostructures as templates for the formation of the diamond nanostructures. In embodiments, the carbon nanostructures are made of amorphous carbon (e.g., carbon with a random long-range arrangement of atoms). Depending on the type of diamond nanostructure to be formed, the amorphous carbon nanostructures can include such shapes as, but not limited to, nanorods, nanofibers, nanotubes, nanodots, etc.

In the methods of the present disclosure, the amorphous carbon nanostructures can be completely or partially converted to diamond nanostructures in an environment at ambient temperature and pressure by melting at least a portion of the amorphous carbon nanostructure to an undercooled state (e.g., a state of matter lower than the equilibrium melting point) and then rapidly quenching (e.g., ultrafast cooling) the melted, undercooled carbon to convert the melted, undercooled portion of carbon to diamond. In embodiments, the carbon is melted to the undercooled state by irradiating the carbon nanostructures with a laser pulse sufficient to melt at least a first portion of the amorphous carbon to the undercooled state. After melting with the laser, the melted, undercooled carbon is quenched to convert at least the first portion of the carbon nanostructure into a diamond nanostructure. Variables, such as, but not limited to, the dimensions of the amorphous carbon nanostructures, the length and/or strength of the laser pulse, and the quenching time (e.g., the rapidity of the quenching) affect the degree of conversion from amorphous carbon to diamond in the nanostructure.

In embodiments, the amorphous carbon nanostructures are carbon nanofibers/nanorods and/or carbon nanotubes. Although some terms describing nanostructures are sometimes used interchangeably herein, in general, nanorods are smaller straight structures, whereas nanofibers can be longer, flexible, and bendable. Nanotubes have a hollow core but can convert into solid nanorods or nanofibers. In embodiments, the efficiency of conversion of the amorphous carbon nanofibers/nanotubes into diamond is increased if the nanofibers/nanotubes are on a substrate and are oriented normal to the substrate.

In embodiments, the amorphous nanostructures are nanofibers/nanorods. In embodiments, the carbon nanofibers have a diameter of about 5 nm to 1000 nm, such as about 5 nm to 500 nm, about 5 nm to 100 nm, about 5 nm to 50 nm, as well as overlapping, intervening ranges, etc. In embodiments, the nanofibers have a diameter of 50 nm or less, e.g., about 10 nm to 50 nm. In embodiments, the nanostructures are nanotubes, which, in embodiments, have a diameter of about 2 nm to 1000 nm, about 2 nm to 500 nm, about 2 nm to 50 nm, as well as overlapping, intervening ranges, etc. As described in greater detail in the examples below, for nanofibers with a thinner diameter, e.g., less than about 50 nm, the entire nanofiber can be converted to diamond (e.g., through the entire thickness of the fiber). However, for thicker nanofibers only portions (e.g., the tip, bends, around the edges) may be converted to diamond, while the core and base portions of the nanofiber may remain amorphous carbon. In embodiments, nanotubes, which may have a thicker diameter, convert to diamond microneedles at the tip or to a solid nanofiber/nanorod and form diamond nanostructures around the surface of the nanotube, while the thicker portions of the nanotube near the center and/or the base may remain as amorphous carbon.

In embodiments, the amorphous carbon nanofibers and/or nanotubes have a length of about 50 nm to 10 mm. In embodiments, the nanofibers/nanotubes can have a length of about 100 nm or greater. In embodiments, they can have a length of about 300 nm or greater. In embodiments, the amorphous carbon nanotubes can be single walled, double walled, or multiwalled. In specific embodiments, the amorphous carbon nanostructures are double-walled nanotubes.

As mentioned above, the duration, wavelength, density, and number of repetitions of the laser pulse can also affect the conversion of the amorphous carbon into diamond. In embodiments, the laser pulse is a nanosecond laser pulse. In embodiments, the duration of the laser pulse is about 10 to 25 nanoseconds, e.g., about 10-20 ns. In embodiments, the laser pulse has a wavelength of about 157 nm to 308 nm (e.g., about 193 nm). In embodiments, the laser pulse has an energy density of about 0.6-1.5 Jcm$^{-2}$. In embodiments, the nanosecond laser pulse is generated by an excimer laser, such as but not limited to, an Argon Fluoride (ArF) laser.

In embodiments, multiple pulses are conducted alternately with quenching to progressively convert the amorphous carbon to diamond via the melted, undercooled state. Thus, in embodiments, subsequent laser pulses are applied sufficient to convert additional portions of the carbon nanostructure into diamond nanostructures. In embodiments the method of the present disclosure includes applying subsequent laser pulses sufficient to convert an entire carbon nanofiber into a diamond nanofiber. In embodiments, the method includes subjecting the amorphous carbon nanostructures to about 1 to 200, or more, laser pulses. For treating large areas laser scanning can be used. In embodiments a 100-200 Hz laser (repetition rate per second) can be used to irradiate an area of about 100-200 cm$^2$ per second.

In embodiments, the rapidity and timing of the quenching also affects the formation of diamond nanostructures. In embodiments, the quenching is accomplished by heat flow into the substrate. In embodiments, the duration of the quenching is about 200 nanoseconds. The quenching involves rapid cooling rate exceeding a billion degrees per second.

In some embodiments, the dimensions of the amorphous carbon nanofiber/nanotube may be too large for complete conversion into diamond. In some such embodiments, diamond nanostructures form on the surface of the carbon nanostructure and are oriented normal to the surface of the carbon nanostructure. In some embodiments, the amorphous carbon nanostructure is a carbon nanotube, and diamond nanorods form on the carbon nanotube, and the nanorods are oriented normal to the surface of the nanotube. In other embodiments, such small surface nanostructures may form even if the entirety of the original amorphous carbon nanostructure is converted to diamond.

Unlike traditional CVD diamond formation, in embodiments of the present disclosure, the diamond is formed without a catalyst and without atomic hydrogen. These so-formed diamond nanostructures have a multitude of possible applications, such as abrasive powders, tool coatings, quantum computing, etc. This process can generate formation of phase-pure diamond structures (e.g., fibers, rods, tubes, etc.) from the nanometer to the micrometer range and beyond. Some embodiments of the present disclosure combine the laser pulsed annealing methods of the present disclosure to convert all or portions of amorphous carbon nanostructures to diamond nanostructure with hot-filament chemical vapor deposition (HFCVD) to form larger diamonds, such as diamond crystallites useful for tools, jewelry, and other applications. In embodiments, the laser-annealed diamond nanostructures are used as seeds for HFCVD growth of larger diamonds.

In embodiments, some methods of forming a diamond include, providing laser-annealed diamond-carbon fibers formed by the methods of the disclosure discussed above and then performing hot-filament chemical vapor deposition (HFCVD) to form diamond crystallites. In embodiments the HFCVD comprises 2.0% $CH_4$ in $H_2$. In embodiments, the HFCVD is performed at a substrate temperature of about 800K-1200K and a filament temperature of about 2000K-2500K (e.g., at 1100K substrate temperature and filament temperature of 2300K). Various CVD methods can be used in combination with the laser annealed carbon fibers to provide diamond materials for a variety of applications.

Additional details regarding the methods, and compositions of the present disclosure are provided in the Examples below. The specific examples below are to be construed as merely illustrative, and not limitative of the remainder of the disclosure in any way whatsoever. Without further elaboration, it is believed that one skilled in the art can, based on the description herein, utilize the present disclosure to its fullest extent. All publications recited herein are hereby incorporated by reference in their entirety.

It should be emphasized that the embodiments of the present disclosure, particularly, any "preferred" embodiments, are merely possible examples of the implementations, merely set forth for a clear understanding of the principles of the disclosure. Many variations and modifications may be made to the above-described embodiment(s) of the disclosure without departing substantially from the spirit and principles of the disclosure. All such modifications and variations are intended to be included herein within the scope of this disclosure, and protected by the following claims.

The following examples are put forth so as to provide those of ordinary skill in the art with a complete disclosure and description of how to perform the methods and use the compositions and compounds disclosed herein. Efforts have been made to ensure accuracy with respect to numbers (e.g., amounts, temperature, etc.), but some errors and deviations should be accounted for. Unless indicated otherwise, parts are parts by weight, temperature is in ° C., and pressure is at or near atmospheric. Standard temperature and pressure are defined as 20° C. and 1 atmosphere.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to 5%" should be interpreted to include not only the explicitly recited concentration of about 0.1 wt % to 5 wt %, but also include individual concentrations (e.g., 1%, 2%, 3%, and 4%) and the sub-ranges (e.g., 0.5%, 1.1%, 2.2%, 3.3%, and 4.4%) within the indicated range. In an embodiment, the term "about" can include traditional rounding according to significant figures of the numerical value. In addition, the phrase "about 'x' to 'y'" includes "about 'x' to about 'y'".

EXAMPLES

Now having described the embodiments of the disclosure, in general, the examples describe some additional embodiments. While embodiments of the present disclosure are described in connection with the example and the corresponding text and figures, there is no intent to limit embodiments of the disclosure to these descriptions. On the contrary, the intent is to cover all alternatives, modifications, and equivalents included within the spirit and scope of embodiments of the present disclosure.

Example 1—Direct Conversion of Carbon Nanofibers and Nanotubes into Diamond Nanofibers and Subsequent Growth of Large-Size Diamonds The present example describes an embodiment of a method of the present disclosure employing a pulsed laser annealing method to convert carbon fibers and nanotubes into diamond fibers at ambient temperature and pressure in air. The conversion of carbon fibers into diamond fibers involves melting in a super undercooled state using nanosecond laser pulses, and quenching rapidly to convert into phase-pure diamond. The conversion process occurs at ambient temperature and pressure, and can be carried out in air. The structure of diamond fibers has been confirmed by x-ray diffraction, selected-area electron diffraction in transmission electron microscopy, electron-back-scatter-diffraction in high-resolution scanning electron microscopy, all showing characteristic diffraction lines for diamond structure. The bonding characteristics were determined by Raman spectroscopy with a strong peak at near 1132 $cm^{-1}$, and high-resolution electro-energy-loss spectroscopy in transmission electron microscopy with a characteristic peak at 292 eV for $\sigma^*$ for $sp^3$ bonding and absence of $\pi^*$ for $sp^2$ bonding. The Raman peak at 1132 $cm^{-1}$ downshifts to 1121 $cm^{-1}$ for diamond nanofibers. This process can be scaled up to cover a large area over 100 to 200 $cm^2$ area per second using 100 to 200 Hz (repetition rate per second). These laser-treated carbon fibers with diamond seeds can be used to grow larger diamond crystallites by using standard hot-filament chemical vapor deposition (HFCVD). Comparing the present results with those obtained without laser treating the carbon fibers reveals superiority of the laser treated carbon fibers in production of diamond fibers. The details of diamond conversion and HFCVD growth are described in greater detail below.

Materials and Methods

The carbon nanofibers (CNFs) were synthesized in a tube furnace-CVD chamber thermally baked at 800° C. Highly sensitive mass flow controllers were used to introduce Ar (450 sccm) and $H_2$ (10 sccm) in the tube furnace prior to the CVD processing. The temperature in the CVD furnace was ramped up to 800° C. and thermally soaked for 10 min. At this temperature, 25 sccm of $C_2H_4$ was introduced in the furnace for 30 minutes. After that, the Ar and $H_2$ gases were flown in the tube furnace and the flow of $C_2H_4$ was switched off. The temperature was then ramped down to room temperature for 2 hours. The prepared CNFs were ultrasonicated to remove unwanted metallic impurities.

These CNFs were then subject to pulsed laser annealing (PLA) processing. The CNF's were irradiated in air with ArF laser pulses (pulse duration=20 ns, wavelength=193 nm, energy density=0.6-1.0 $Jcm^{-2}$). Due to the restriction of heat flow in one-dimensional CNFs, melting of amorphous carbon occurred, leading to a highly undercooled state. The undercooled state was subsequently quenched to form nanostructures of diamond.

Increasing the number of nanosecond laser pulses resulted in the entire fibers being converted into diamond fibers (DNFs). The CNFs (before and after PLA processing) were dispersed in ethanol and transferred onto copper TEM grids. To facilitate the bleeding of electronic charges, the sample was sandwiched between two copper grids and then mounted in the TEM sample holder. The laser-annealed carbon fibers were used for seeding the diamond growth by HFCVD (hot-filament chemical vapor deposition with 2.0% $CH_4$ in $H_2$) at 1100K substrate temperature and filament temperature of 2300K. These structures were characterized by TEM, SAED, EBSD, SEM, and Raman spectroscopy (using 532 nm excitation laser). High-resolution SEM (and EDX) and EBSD (electron-scatter-back diffraction) measurements were carried out using FEI Verios 460L SEM and FEI Quanta 3D FEG FIB-SEM, respectively. The EBSD technique provided three-dimensional (Kikuchi) diffraction patterns for phase identification and structural morphology was determined by high-resolution SEM. The JEOL 2000 FX was used for performing the TEM and SAED of the CNFs and DNFs. A 200 kV electron beam from LaB6 source (having point-to-point resolution of 0.14 nm) was used for the TEM imaging and diffraction. An Aberration-corrected STEM-FEI Titan 80-300 with energy resolution of 0.15 eV was used to perform EELS (electron energy loss spectroscopy) to characterize the bonding and the structure of diamond and amorphous carbon. A HORIBA Xplora PLUS confocal Raman microscope having 0.5 µm spatial resolution and 532 nm excitation source was used for determining the Raman active vibrational characteristics (at 300 K) of the CNFs and DNFs. The Raman spectroscopy provides a distinctive identification of diamond and related materials.

Results and Discussion

FIG. 1A shows an SEM micrograph of pristine carbon nanofibers before pulsed laser annealing where the structure of carbon is amorphous and contains some surface roughness (FIG. 1A). This surface roughness increases with size or diameter of the nanofiber. After a single 20 ns (193 nm ArF) laser pulse at ambient temperature and pressure, a direct conversion of carbon nanofiber into crystalline diamond was observed (FIG. 1B). The conversion process starts at the tips and bends and is more efficient for thinner fibers (less than 50 nm diameter for this diameter. FIG. 1B shows a comparison of the conversion of thin 35 nm diameter fiber, whereas 50 nm diameter fiber shows formation of nanodiamonds only on the surface.

FIG. 2 shows a large number of carbon fibers after laser annealing with 10 laser pulses, where the effect of size (diameter) and orientation of fibers with respect to laser beam are clearly shown. The carbon fibers with diameter less than 50 nm diameter are converted fully into diamond, whereas larger diameter fibers show the formation of diamond on the surface. These diamond nuclei on the surface can grow normal to the carbon fiber during irradiation with subsequent pulses forming small nanorods.

The crystal structure determination of as-grown DNFs was carried out by the electron beam scatter diffraction (EBSD) technique in the high-resolution SEM. The EBSD is a powerful non-destructive technique to determine the details of atomic structure of crystalline phases by providing three-dimensional diffraction (Kikuchi) patterns. The electron probe size used for EBSD is ~10 nm and thus it is ideal for determination of structure along the length of the diamond fiber. The EBSD results for the indicated area shown in the left-hand image in FIG. 3 (near the tip of the fiber) demonstrate characteristic Kikuchi diffraction pattern of diamond (FIG. 3, top right) and relative crystal orientation (cube shown in FIG. 3, bottom right). There was a minimal change in the crystal orientation (Kikuchi diffraction pattern) along the length from the tip, as revealed by the EBSD patterns. The highest undercooling occurs at the tip and falls moving more towards the base (of the CNF). The amorphous nature of CNF was found to be unaltered close to its base.

Figure 4:
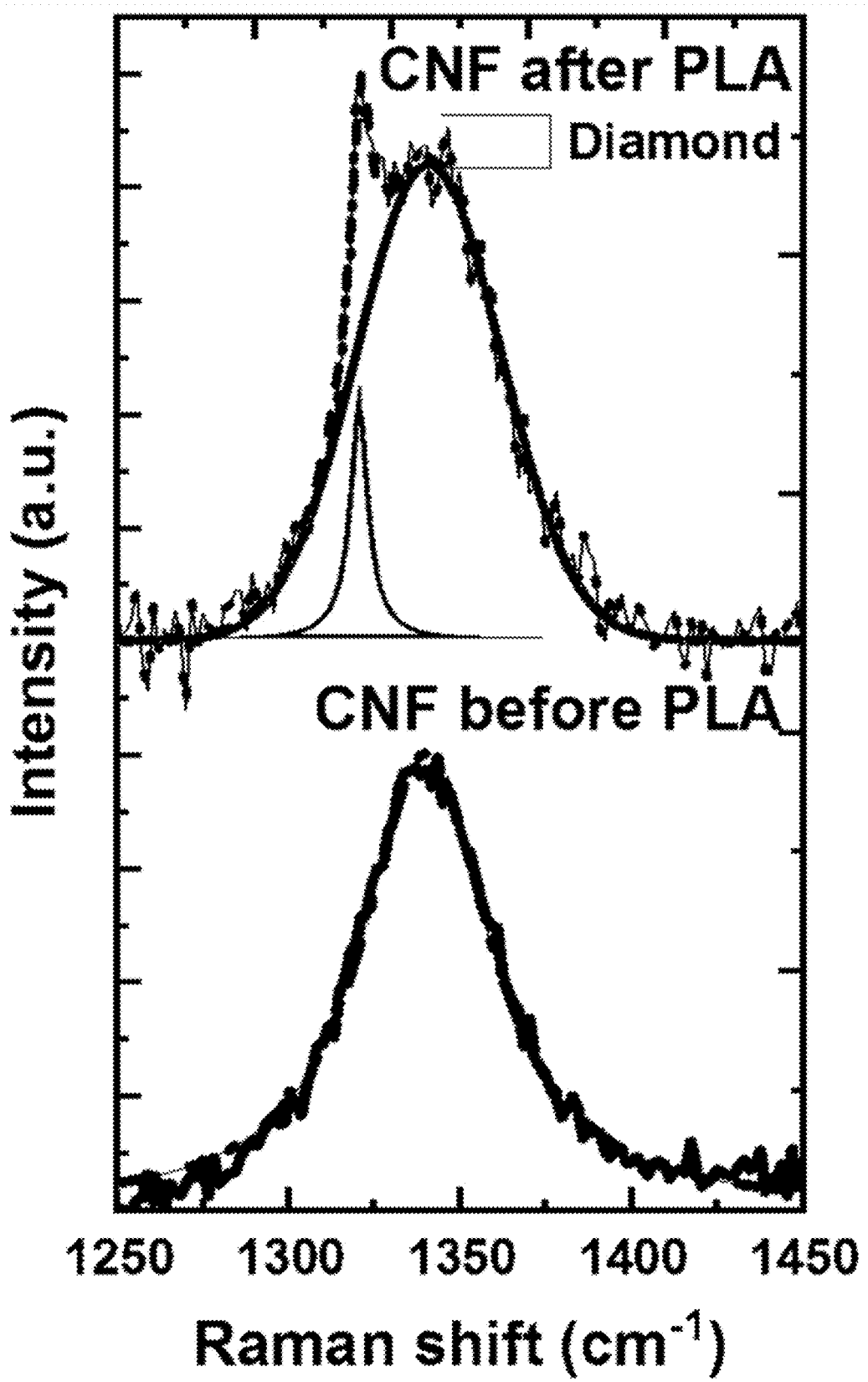
FIG. 4 is an image of a Raman spectra before (bottom) and after (top) laser annealing, clearly showing diamond peak near 1121 $cm^{-1}$, which downshifted from standard 1132 $cm^{-1}$ peak as a result of phonon confinement.

Raman results from carbon nanofibers before (bottom) and after (top) laser treatment are illustrated in FIG. 4. The Raman peak corresponding to nanodiamonds is observed ~1321 $cm^{-1}$ in the CNF samples after the PLA processing. The downshift of ~11 $cm^{-1}$ (from 1332 $cm^{-1}$ in microdiamonds) and spectral broadening are due to phonon confinement [17] in nanosized diamonds (formed after PLA). Therefore, Raman studies provide clear evidence for conversion of CNFs into nanodiamonds (due to laser-assisted melting and resolidification) after the PLA treatment.

Figure 5B:
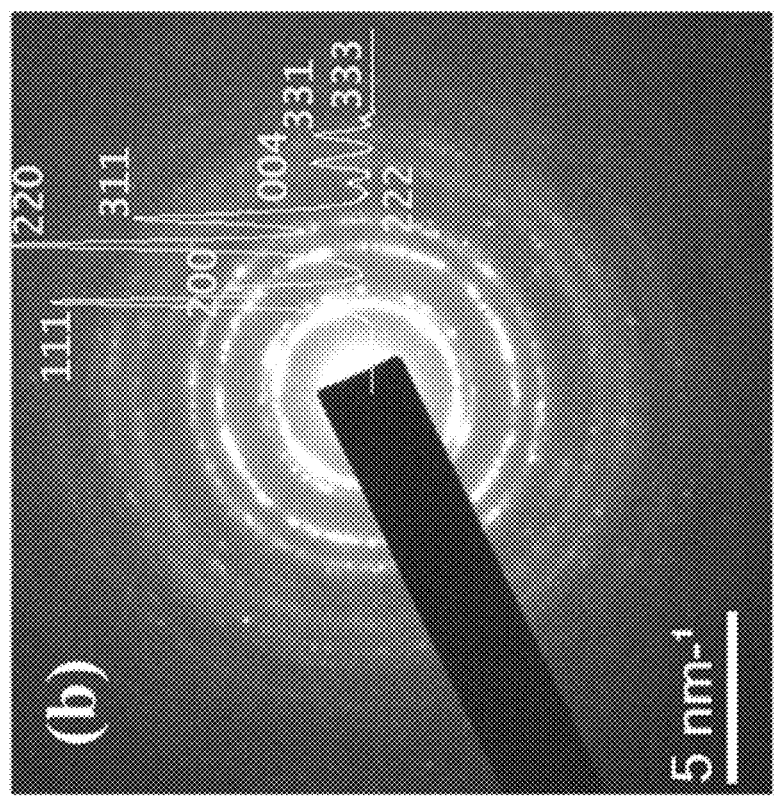
FIG. 5B illustrates an SAED pattern showing characteristic diamond diffraction rings.
Figure 5A:
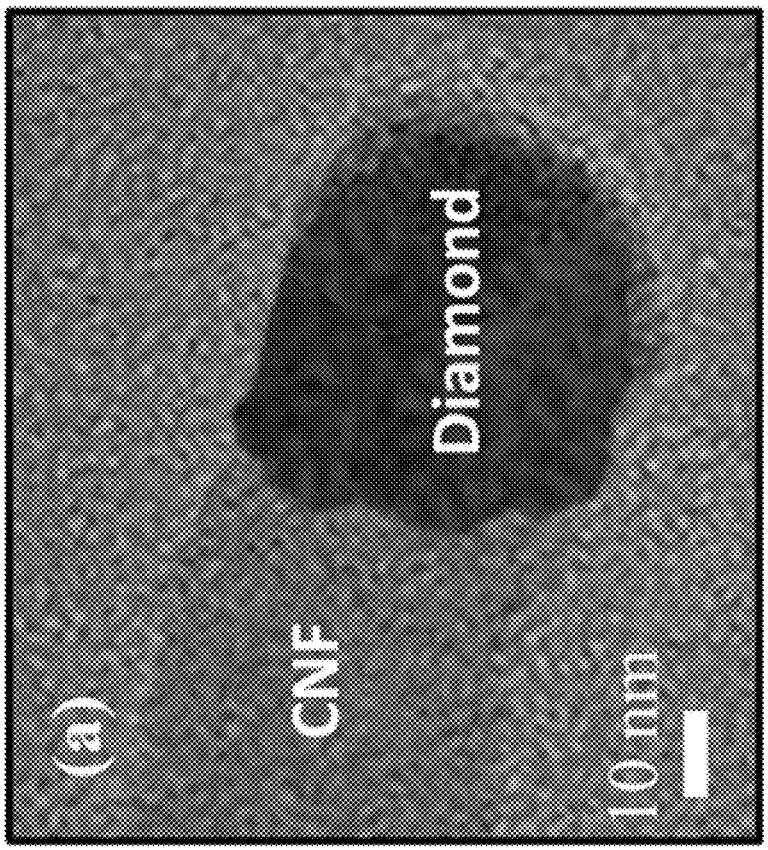
FIG. 5A is TEM micrograph showing carbon nanofiber and diamond formation at the tip.

FIGS. 5A-B depict the TEM (transmission electron microscopy) and SAED (selected-area electron diffraction) analysis of carbon fibers after laser annealing. FIG. 5A shows the formation of diamond near the tip of the carbon fibers. The SAED pattern covering many nanodiamond tips, which are oriented differently, is shown in FIG. 5B. The SAED pattern shows characteristic diffraction pattern (diffraction rings) of nanocrystalline diamond showing the distinct diffraction peaks of 111, 200, 220, 311, 222, 004, 331, and 333 planes. The diffraction from the base of the fiber contained characteristic amorphous structure, which is similar to that of unirradiated carbon.

Figure 6A:
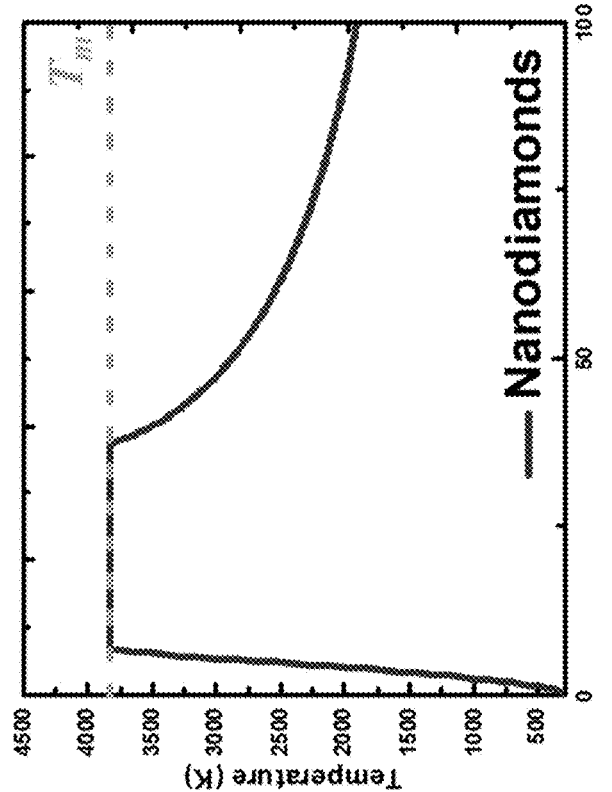
FIGS. 6A and 6B are graphs illustrating simulation of laser interaction with matter (SLIM) calculations using the following parameters: Melting temperature: 3823 K, Evaporation temperature: 5000 K, Latent heat of melting: 19775 J/cm3, Thermal conductivity of solid: 3 W/mK, Thermal conductivity of molten carbon: 2.9 W/cmK, Absorption coefficient in solid state: 8.00e+05, Absorption coefficient in liquid state: 1.00e+06, Reflectivity in solid state: 0.3, Reflectivity in liquid state: 0.6, Annealing energy density: 0.6 $J/cm^2$, Laser pulse width: 20 ns.
Figure 6B:
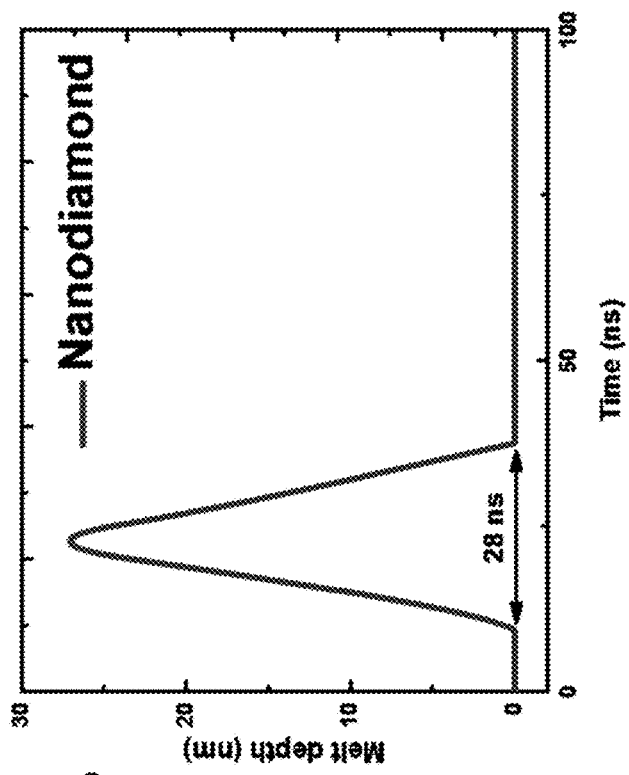

FIG. 6A is a graph of the theoretical calculation of Melt depth of carbon substrate was theoretically calculated as function of time as illustrated in FIG. 6A. The carbon was found to melt in a highly undercooled state, and quenching from this state leads to the formation of diamond. The melting starts after 10 ns of the incidence of the laser pulse, melt-in front rapidly penetrates up until the end of the laser pulse. After that, solidification occurs with underlying seed. As shown in FIG. 6B, the solidification velocity is of the order 2-5 $ms^{-1}$. The temperature profile in FIG. 6A shows that amorphous carbon melts at ~4000K in a highly undercooled state, close to 1000K below the equilibrium melting of graphite. These calculations were performed using SLIM Computer program using the following: a melting temperature [18]: 3823 K, Evaporation temperature: 5000 K, Latent heat of melting: 19775 $J/cm^3$, Thermal conductivity of solid: 3 W/mK, Thermal conductivity of molten carbon: 2.9 W/cmK, Absorption coefficient in solid state: 8.00e+05, Absorption coefficient in liquid state: 1.00e+06, Reflectivity in solid state: 0.3, Reflectivity in liquid state: 0.6, Annealing energy density: 0.6 $J/cm^2$, Laser pulse width: 20 ns.

These results demonstrate that the pulsed laser annealing of CNF leads to melting of carbon, and subsequent quenching from a highly undercooled state results in the direct conversion of carbon into diamond. Earlier studies on melting of amorphous carbon films on sapphire substrates have shown that molten carbon can be converted into diamond at an undercooling ~1000K, and into a new form of carbon (named Q-carbon) at a higher undercooling at ambient temperatures and pressures in air.

Figure 7B:
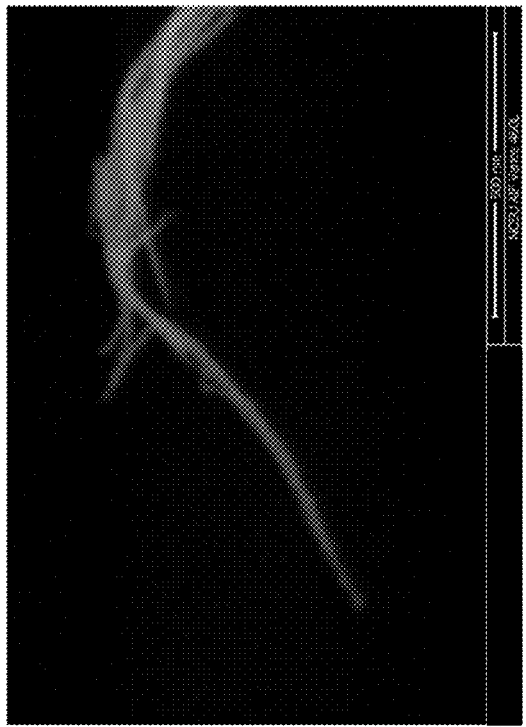
FIGS. 7A-7D are images illustrating conversion of carbon nanotubes into diamond nanorods.
Figure 7D:
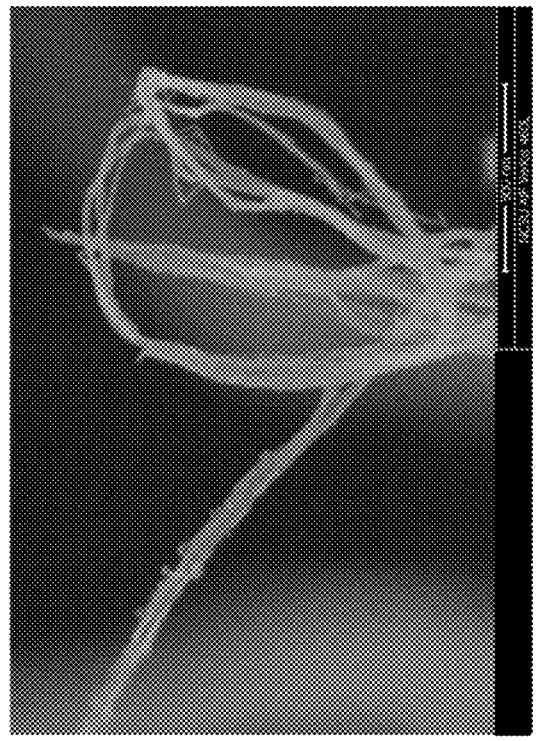
Figure 7A:
Figure 7C:
Figure 8:
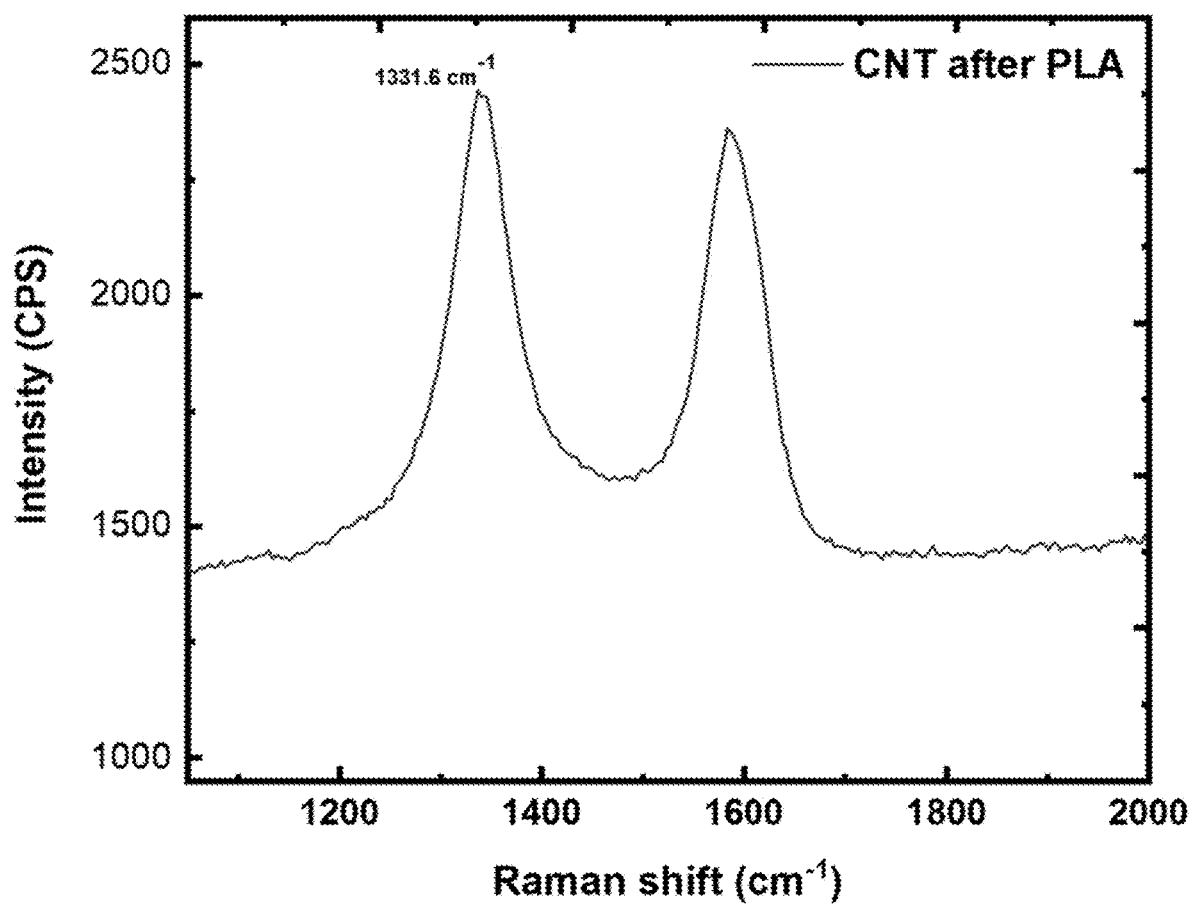
FIG. 8 is a Raman spectrum of nanotubes after 10 pulses of ArF laser (pulse duration 20 ns) at 0.65 Jcm$^{-2}$, showing the presence of diamond and characteristic D and G peaks from unconverted nanotubes.

FIGS. 7A-7D are magnified images illustrating conversion of carbon nanotubes into diamond nanofibers after 10 laser shots at 0.65 $Jcm^{-2}$ of the ArF laser. The conversion process in the case of nanotubes is similar to that of nanofibers, as the conversion process starts from the tips and bends, and it is more efficient for both nanotubes and fibers which are aligned normal to the substrate. The diameter of carbon nanotubes ranged from 10-50 nm (mostly double-walled) with over 300 nm in length. FIG. 7A shows a low-magnification SEM image, showing nanotubes of varying sizes with diamond formation near the tips. The diamond tips are considerably sharper due to smaller amount of carbon available in the hollow nanotubes. The details of diamond conversion near the tips are shown in FIGS. 7B and 7C, where nanodiamond beads are formed with a direct evidence of carbon melting during the conversion process. FIG. 7D shows the formation of nanodiamonds normal to the carbon nanotubes. These results show the formation of sharp diamond nanoneedles by this direct conversion of carbon nanotubes into diamond. The Raman spectrum after laser annealing (in FIG. 8) shows Raman peak ~1327 $cm^{-1}$, which downshifted from 1332 $cm^{-1}$ due to phonon confinement. The spectrum also contains Raman peak at 1336 $cm^{-1}$, corresponding to unconverted carbon nanotubes and a peak at approximately 1580 $cm^{-1}$ corresponding to unconverted carbon.

Figure 9A:
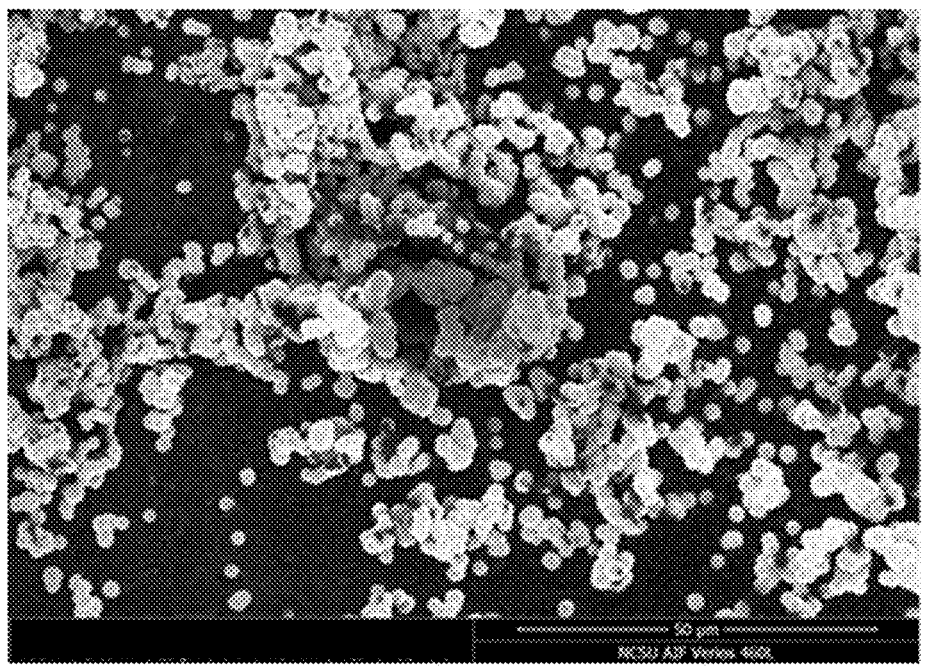
FIGS. 9A and 9B are images illustrating hot-filament chemical vapor deposition (HFCVD) growth of diamond after laser annealing of carbon fibers (five microns diameter) with one pulse (FIG. 9A) and HFCVD growth on untreated carbon fibers (FIG. 9B) for a comparison.
Figure 9B:
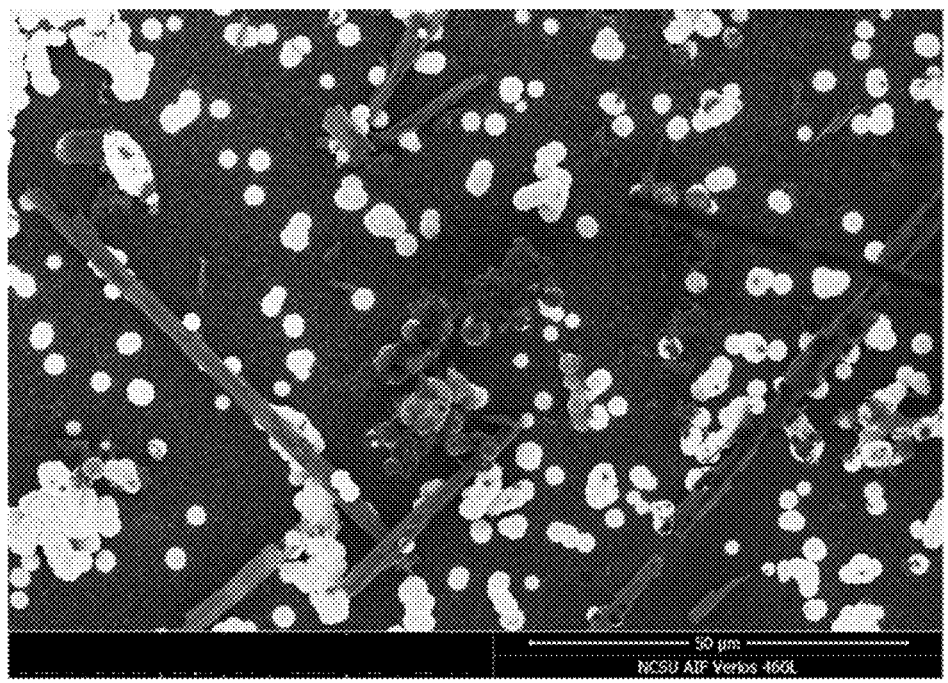

The formation of large diamond crystallites in HFCVD reactor is illustrated in FIGS. 9A and 9B after deposition for three hours by using the seeding of laser annealed diamond nanofibers (FIG. 9A) or untreated fibers (FIG. 9B). These crystallites have remarkably uniform size, where the average size of diamond crystallites was determined to be 2.2 μm. This is consistent with average diamond nuclei of about 100 nm with growth rate of about 700 nm/hr. The 100 nm diamond nuclei are formed from undercooled liquid carbon in 50 ns with diamond growth rate of about 2 ms$^{-1}$. FIG. 9B shows diamond HFCVD growth on carbon nanofibers which were not treated with lasers.

Figure 10A:
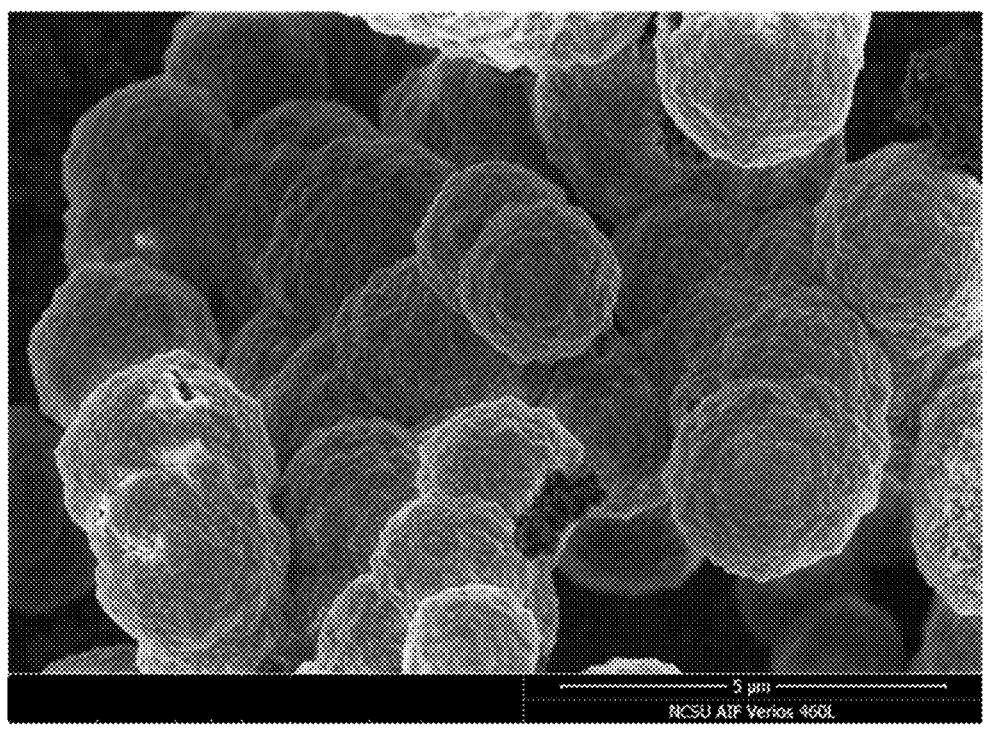
FIGS. 10A and 10B are images illustrating a mechanism of HFCVD growth from laser treated fibers, showing multiple layers of diamond growth (FIG. 10A) and HFCVD growth of diamond on untreated fibers (FIG. 10B), demonstrating that laser treated fibers provide more effective sites for diamond growth during HFCVD.
Figure 10B:
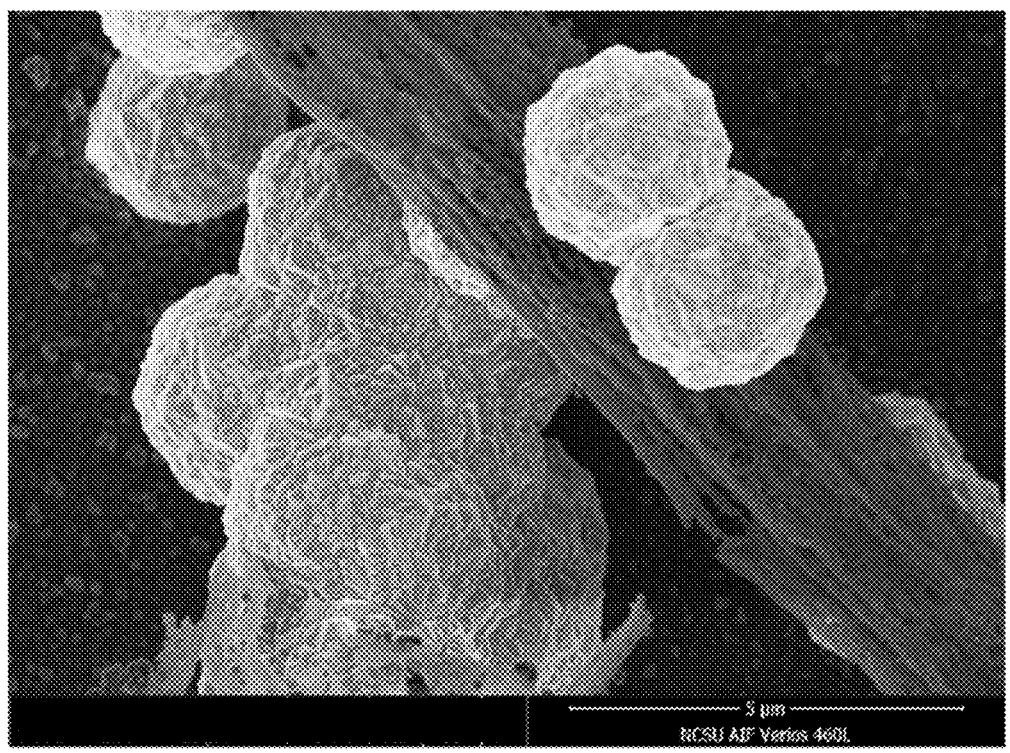

The number density of diamond crystallites is considerably higher for laser-annealed fibers (FIG. 9A) compared to untreated carbon fibers (FIG. 9B). The laser treated fibers are totally consumed by diamond growth, because of much higher number density of diamond nuclei formed after laser annealing. In the case of untreated fibers, number density of diamond nuclei is considerably lower, as they are formed on the surface of fibers associated with strain centers and pits. The laser-treated fibers are totally consumed with a very high number density of diamond crystallites, as shown in FIG. 10A at a higher magnification. FIG. 10B shows the growth of diamond crystallites on the surface of untreated carbon fibers. These diamond crystallites merge and lead to formation of larger size crystallites. Both treated and untreated fibers show secondary nucleation of diamond crystallites. It should be mentioned that source for carbon in diamond growth is enhanced due to additional carbon containing species from the fibers. In the treated samples, nanodiamond nuclei formed after laser annealing provide a very effective nucleation sites. In untreated samples, diamond nucleation starts from the surface roughness at pits, which may provide strain centers for diamond nucleation and subsequent growth. It should be mentioned that there is hardly any diamond growth observed on pristine sapphire three-hour HFCVD growths (not shown).

Figure 11:
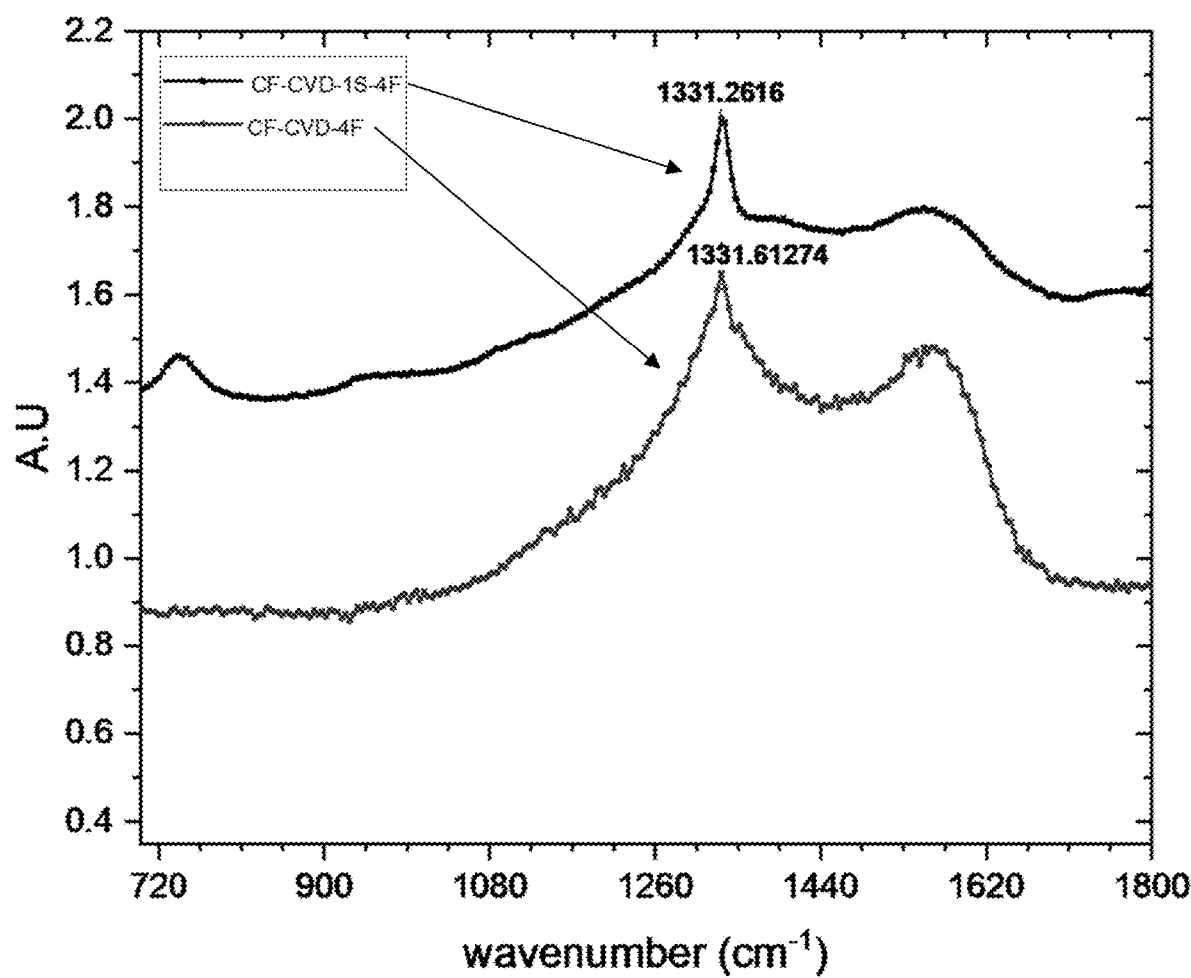
FIG. 11 is a characteristic Raman spectra from HFCVD grown diamond on treated and untreated carbon fibers, showing some graphitic peak in untreated samples.

FIG. 11 shows characteristic Raman spectra results from diamond after HFCVD growth from laser treated (CF-CVD-1S-4F) and untreated (CF-CVD-4F) samples. The Raman peak at 1331 26 cm$^{-1}$ is only slightly down shifted from the bulk diamond peak at 1332 cm$^{-1}$, indicating the presence of nanocrystalline diamond. The presence of G-peak at 1580 cm$^{-1}$ (associated with graphitic carbon) is very weak for diamond growth in laser treated fibers, characteristic of high-quality phase pure diamond. The G peak is more pronounced in untreated samples (CF-CVD-4F) due to the presence of unconsumed carbon fibers, compared to the laser-treated samples (CF-CVD-1S-4F).

The formation of DNFs starts with nucleation of diamond from the highly undercooled state of molten carbon (formed after PLA). The formation of diamonds occurs by a homogeneous nucleation from the highly undercooled state of carbon. The change in Gibbs free energy ($\Delta G_T$) associated with the formation of DNFs consists of a gain in volume energy ($\sim r^3$) at the expense of surface energy ($\sim r^2$), where r is the radius of diamond nucleus. The change in free energy can be calculated using the equation:

$$\Delta G_T = \frac{-4}{3}\pi r^3 \frac{\rho}{M_m}\frac{\Delta H_m}{T_m}\Delta T_u + 4\pi r^2 r_s,$$

where $\rho$ is the density of diamond, $\Delta H_m$ is the latent heat of melting, $M_m$ is the molar mass, and $r_s$ is the surface free energy between diamond nuclei and the undercooled state of carbon. The first term in the equation is the volume energy term (gain in free energy for the formation of diamond nucleus from the undercooled state), whereas the second one is the surface energy term. The degree of undercooling, $\Delta T_u$ is equal to $T_m - T_r$, where $T_m$ indicates melting point of graphite (~5000 K) and $T_r$ indicates the nucleation temperature (~4000 K). With an increase in the value of $\Delta T_u$, $\Delta G_T$ becomes more negative and a conversion of graphite (CNFs) to diamond (DNRs) is favorable. Again, the critical radius and change in Gibbs free energy $$\left(\text{at } \frac{d\Delta G_T}{dr} = 0\right)$$

is inversely proportional to $\Delta T_u$ and $\Delta T_u^2$, respectively. Therefore increasing $\Delta T_u$ reduces the critical value of diamond radius and change in Gibbs free energy ($\Delta G_T^*$). The rate of nucleation (I) is given by the equation:

$$I \sim \exp\frac{-\Delta G_T^*}{KT_r}.$$

Therefore, with a decrease in the value of $\Delta G_T^*$, the rate of nucleation increases thereby facilitating the formation of diamond.

For a 10 nm size nanodiamond, the estimated growth time is about 5-10 ns. This time requirement emphasizes the importance of thermal conductivity of the substrate during rapid pulse laser heating. A rough estimate of r* for diamond nuclei from equation is ~20 Å, where diamond surface free energy $r_s$ is 0.6 Jm$^{-2}$, $T_m$=4000 K, $\Delta H_m$=1.0 eV/atom, $\Delta T_u$=1000 K, and $\rho$=3.5 gm/cm$^{-3}$. This is verified experimentally earlier papers on diamond [4-6] and on silicon [19-21]. The growth velocity (v) is directly related to the undercooling by the follow equation:

$$v = \frac{D_\infty f}{\lambda f_D}\left(1 - e^{\frac{(T_m - T_u)\Delta S}{kT}}\right),$$

where, $D_\infty$, f, $\lambda$, $f_D$, k, T, $T_m$, $T_u$ and $\Delta S$ denote the liquid diffusivity (~10$^{-8}$ m$^2$/sec in liquid state), fraction of the available sites, atomic jump distance, geometrical factor associated with diffusion, Boltzmann constant, temperature, melting temperature, undercooling temperature, and the change in entropy, respectively. An increase in the value of $T_u$ decreases the value of chemical free energy barrier for graphite to crystalline diamond phase transformation. This also increases the velocity of the melt-front. Therefore, the values of undercooling dictate the conversion of amorphous graphitic phase into diamond via the carbon melt. If the cooling rate is slow (low undercooling and low solidification velocity), crystalline graphite is formed whereas with high cooling rates (large undercooling and large solidification velocity), crystalline diamond is formed.

This example demonstrates the formation of diamond nanofibers from carbon nanofibers and carbon nanotubes by using a highly non-equilibrium technique of pulsed laser annealing. Upon irradiating the CNFs with nanosecond ArF laser, the tips and bends of the CNFs are melted in a highly undercooled state. The highly undercooled state of carbon is a metastable phase, and nanodiamonds nucleate from this state. The process (rapid melting, solidification, and growth)

is completed in less than 200 ns. These results clearly indicate that diamond can be formed at ambient conditions in air from the super undercooled state of carbon without catalyst and atomic hydrogen (CVD process). The nanosecond laser parameters and heat confinement by the one-dimensional CNFs determine the temperature distribution and undercooling and play a critical role in nucleation and growth of nanodiamonds. The nanosecond laser pulses help achieve the undercooled state of carbon and, upon subsequent quenching, leads to the formation of nanodiamonds from CNFs. The nanosecond laser heating and temperature distributions are confined spatially and temporally. Therefore, the tips (and bends) of CNFs melt whereas the underlying areas are unaffected. By subsequent laser pulses, these diamond regions can be extended to form larger diamond nanofibers and nanorods. The formation of DNFs and their heterostructures will have exciting applications ranging from drug delivery to optoelectronics and field emitters [22]. This discovery of conversion of CNF tips into diamond nanofibers at room temperature and atmospheric pressure will open a new frontier for synthesis and processing of diamond nanostructures for a variety of applications.

In embodiments of methods of the present disclosure, such as described in the present example, carbon nanotubes and carbon fibers were melted in a super undercooled state using high-power nanosecond laser pulses, and quenched rapidly to convert them into phase-pure diamond rods. The conversion process occurred at ambient temperature and pressure, and was be carried out in air. This process of conversion of carbon into diamond can be scaled by laser scanning, where 200 Hz laser can generate 200 cm² area per second. The methods of the present disclosure lead to the formation of phase-pure diamond rods across the scale ranging from a few nanometers to micrometers and beyond depending upon initial size of carbon nanotubes and carbon fibers. These nano- and microdiamonds can be used effectively as seeds to grow large diamonds by CVD methods for a variety of applications ranging abrasive powders for oil and gas exploration to diamond jewelry.

REFERENCES

1 J. C. Angus and C. C. Hayman, Science, 1988, 241, 913-21.
2 J. Narayan, V. P. Godbole and C. W. White, Science, 1991, 252, 416-8.
3 F. P. Bundy, H. T. Hall, H. M. Strong and R. H. Wentorf, Nature, 1955, 176, 51-55.
4 J. Narayan and A. Bhaumik, J. Appl. Phys., 2015, 118, 215303.
5 J. Narayan and A. Bhaumik, APL Mater., 2015, 3, 100702.
6 J. Narayan and A. Bhaumik, J. Appl. Phys., 2016, 119, 185302.
7 E.-S. Bai, Y. J. Baik, and D. J. Leon, J. Mater. Res., 15, 923 (2000).
8 Y. Ando, Y. Nishibayashi, and A. Sawabe, Diamond Related Materials, 13, 633 (2004).
9 L. T. Sun, J. L. Gong, D. Z. Zhu, Z. Y. Zhu and S. X. He, Adv. Mater., 2004, 16, 1849-1853.
10 C.-H. Hsu, S. G. Cloutier, S. Palefsky and J. Xu, Nano Lett., 2010, 10, 3272-3276.
11 B. Wei, J. Zhang, J. Liang, and D. Wu, Carbon 36, 997 (1998).
12 C. Luo, X. Qi, C. Pan and W. Yang, Sci. Rep., 2015, 5, 13879.
13 F. Zhang, J. Shen, J. Sun, Y. Q. Zhu, G. Wang and G. McCartney, Carbon N. Y., 2005, 43, 1254-1258.
14 S. Ozden, L. D. Machado, C. Tiwary, P. A. S. Autreto, R. Vajtai, E. V. Barrera, D. S. Galvao and P. M. Ajayan, ACS Appl. Mater. Interfaces, 2016, 8, 24819-24825.
15 W. K. Wang and L. M. Cao, Russ. Phys. J., 2001, 44, 178-182.
16 J. Zhang, R. Wang, X. Zhu, A. Pan, C. Han, X. Li, D. Dan Zhao, C. Ma, W. Wang, H. Su and C. Niu, Nat. Commun., 2017, 8, 683.
17 S. Prawer and R. J. Nemanich, Philos. Trans. R. Soc. London A. 2004, 362, 2537-2565.
18 R. K. Singh and J. Narayan, Mat. Sci. and Eng. B(3), 217 (1989).
19 J. Narayan and C. W. White, Appl. Phys. Lett., 1984, 44, 35.
20 J. Narayan, C. W. White, O. W. Holland and M. J. Aziz, J. Appl. Phys., 1984, 56, 1821.
21 R. F. Wood, D. H. Lowndes and J. Narayan, Appl. Phys. Lett., 1984, 44, 770.
22 R. Narayan, Diamond-based materials for biomedical applications, Woodhead Publications, 2013.

The invention claimed is:

1. A method of forming diamond nanostructures, the method comprising:
   providing carbon nanofibers, carbon nanotubes, or a combination thereof, wherein the carbon nanofibers, nanotubes, or a combination thereof comprise carbon;
   in an environment at room temperature and atmospheric pressure, irradiating tips of the carbon nanofibers, carbon nanotubes, or a combination thereof with a laser pulse sufficient to melt at least a first portion of the carbon at the tip of the carbon nanofiber, carbon nanotube, or a combination thereof to an undercooled state; and
   quenching the melted carbon from the undercooled state to convert at least the first portion of the carbon at the tip of the carbon nanofiber, carbon nanotube, or a combination thereof into a diamond nanostructure.

2. The method of claim 1, wherein the nanofibers, nanotubes or combination thereof are on a substrate and are oriented normal to the substrate.

3. The method of claim 1, wherein the nanofibers, nanotubes or combination thereof have a diameter of about 5 nm to over 1000 nm.

4. The method of claim 1, wherein the carbon nanofibers have a diameter of about 50 nm or less.

5. The method of claim 1, wherein the carbon nanofibers, nanotubes or combination thereof have a length of about 50 nm to 10 mm.

6. The method of claim 1, wherein the laser pulse is a nanosecond laser pulse.

7. The method of claim 6, wherein a duration of the laser pulse is about 10-20 ns.

8. The method of claim 1, wherein the laser pulse has a wavelength of about 157 nm to 308 nm.

9. The method of claim 1, wherein a duration of the quenching is about 200 nanoseconds.

10. The method of claim 1, further comprising applying subsequent laser pulses to the nanofibers, nanotubes or combination thereof sufficient to convert additional portions into diamond nanostructures extending from the tip toward a base of the nanofibers, nanotubes or combination thereof.

11. The method of claim 10, wherein about 2 to 200 laser pulses are applied to the carbon nanofibers, nanotubes or combination thereof.

12. The method of claim 1, wherein diamond nanostructures form on the surface of the carbon nanofibers, nanotubes or combination thereof and are oriented normal to the surface of the carbon nanostructures nanofibers, nanotubes or combination thereof.

13. The method of claim 1, wherein the carbon nanofibers, nanotubes or combination thereof comprise a nanofiber and further comprising applying subsequent laser pulses sufficient to convert the entire carbon nanofiber into a diamond nanofiber.

14. The method of claim 1, wherein the carbon nanofibers, nanotubes or combination thereof comprise a nanotube and forms a diamond nanoneedle or microneedle.

15. A method of forming diamond nanostructures, the method comprising:
providing carbon nanostructures in the form of carbon nanofibers and/or carbon nanotubes comprising carbon;
in an environment at room temperature and atmospheric pressure, irradiating tips the carbon nanostructures with a laser pulse sufficient to melt at least a first portion of the carbon nanostructure at the tips to an undercooled state;
quenching the melted first portion from the undercooled state to convert at least the first portion into diamond; and
repeating the melting and quenching steps to convert additional portions of the carbon nanostructure into diamond extending from the tip toward a base of the nanofibers and/or nanotubes.

16. A method of forming diamond, the method comprising:
providing diamond nanostructures formed by the method of claim 1 comprising laser-annealed diamond-carbon nanostructures, and performing hot-filament chemical vapor deposition (HFCVD) of the laser-annealed diamond-carbon nanostructures to form diamond crystallites.

17. The method of claim 16, wherein the HFCVD is performed with 2.0% $CH_4$ in $H_2$.

18. The method of claim 16, wherein HFCVD is performed at a substrate temperature of about 800K-1200K and a filament temperature of about 2000K-2500K.

* * * * *